United States Patent [19]
Woskov et al.

[11] Patent Number: 4,968,945
[45] Date of Patent: Nov. 6, 1990

[54] OPEN TUBE RESONATOR TEST SETUP FOR CONDUCTIVITY MEASUREMENTS

[75] Inventors: Paul P. Woskov, Bedford; Daniel R. Cohn, Chestnut Hill, both of Mass.

[73] Assignee: Massachusetts Institute of Technology, Cambridge, Mass.

[21] Appl. No.: 278,818

[22] Filed: Dec. 2, 1988

Related U.S. Application Data

[63] Continuation-in-part of Ser. No. 121,923, Nov. 18, 1987, Pat. No. 4,918,049.

[51] Int. Cl.[5] ...................... G01R 27/32; G01N 22/00

[52] U.S. Cl. .................................... 324/633; 324/636; 324/653; 324/708

[58] Field of Search ..................... 324/58.5 C, 58.5 A, 324/58.5 R, 58 C, 58 A, 58 R, 57 SS, 64, 633, 636, 653, 652, 691, 708

[56] References Cited

U.S. PATENT DOCUMENTS

| | | | |
|---|---|---|---|
| 3,448,379 | 6/1967 | Rosenbaum | 324/58 C |
| 4,507,602 | 3/1985 | Aguirre | 324/58 R |

OTHER PUBLICATIONS

Takeda et al., "Measurements of High Electron Densities by the $TM_{010}$ Cavity", Japanese Journal of Applied Physics, vol. 9, No. 7 (7/70) pp. 806–811.
Hinds et al., "Material-Properties Analyzers Using Superconducting Resonators", Journal of Applied Physics, vol. 42, No. 1 (1/71) pp. 170–179.
Tischer et al., "Resonant Cavities for the Measurement of the Surface Resistance of Conductors at Millimeter Wavelengths", Rev. Sci. Instrum., vol. 46, No. 1 (1/75) pp. 11–14.
Korobkin et al., "Determination of the Parameters of Dielectrics at Ultrahigh Frequencies by Means of Waveguide-Dielectric Resonances", Inst. and Exper. Techs., vol. 19, No. 3, Pt. 2 (12/76) pp. 797–800.
Isagawa, "A New Method for Measuring the Low–Temperature Dielectric Property of a Low-Loss Material with a Superconducting Resonant Cavity", Japanese Journal of Applied Physics, vol. 15, No. 11 (11/76) pp. 2059–2066.
Kooi et al., "Measurement of Dielectric Loss Using a Cut-Off Circular Waveguide Cavity", IEEE Trans. on Inst. and Meas., vol. IM-29, No. 1 (3/80) pp. 44–48.
Woskoboinikow, et al., "Nondestructive Gyrotron Cold–Cavity Q Measurements", IEEE Transactions on Microwave Theory and Techniques, MIT-35, pp. 96–100 (1987).
Vainshtein, "Open Resonators for Lasers", Soviet Physics JETP, 17, pp. 709–719 (1963).
Fathy, et al., "Microwave Characteristics and Characterization of High $T_c$ Superconductors", Microwave Journal, Oct. 1988, pp. 75–94 (1988).
(List continued on next page.)

*Primary Examiner*—Reinhard J. Eisenzopf
*Assistant Examiner*—Robert W. Mueller
*Attorney, Agent, or Firm*—Choate, Hall & Stewart

[57] ABSTRACT

An apparatus and method for measurement of ohmic loss and surface resistivity is provided with a straight lumen waveguide with at least one opening at one end. Diffraction of radiation introduced to the lumen at one end of the tube provides feedback to establish resonances within the tube. Using the "whispering gallery" resonant modes maximizes the total ohmic loss and thereby enhances sensitivity of resistivity measurements. The angle at which resonant radiation exits the lumen is a function of the mode and size of the operative. Thus, preferred spatial detection allows enhancement of the device signal while discriminating against undesired modes. Selection of modes allows high frequency measurements, into the tetraherz range, to be made without disabling restrictions in the device dimensions, spatial input/output coupling or ohmic loss depending on alignment for analysis of, for example, high temperature superconductors. Furthermore, more than one longitudinal mode for a given transverse mode can be detected allowing for an unambiguous determination of ohmic losses from a measurement of the total Q.

38 Claims, 3 Drawing Sheets

OTHER PUBLICATIONS

Hinderks, et al., "Copper Conductivity at Millimeter-Wave Frequencies", The Bell System Technical Journal, 59, pp. 43–65, (1980).

Collin, "*Foundations for Microwave Engineering*", published by McGraw-Hill Book Company, 1966.

Felch, et al., "Design Considerations for a 100 kWCW, 140 GHz Gyrotron Oscillator", IEDM, 84, pp. 834–837, (1984).

Percival, et al., "Measurements of High-$T_c$c Superconductivity in a Microwave Cavity", Electronics Letters, 23, pp. 1225–1226, (1987).

Awasthi, et al., "Millimeter-Wave Surface Impedance Measurements of $YBa_2Cu_3O_{7-\delta}$ Ceramic Superconductors", Solid State Communications, 67, pp. 373–377, (1988).

OPEN TUBE RESONATOR TEST SETUP FOR CONDUCTIVITY MEASUREMENTS

This application is a continuation in part of U.S. application Ser. No. 121,923 by Cohn et al., filed Nov. 18, 1987, now U.S. Pat. No. 4,918,049 and entitled "Microwave/far-infrared Cavity and Waveguides using High Temperature Superconductors".

FIELD OF THE INVENTION

This invention relates to waveguides and resonators and more particularly relates to the measurement of ohmic loss and surface resistivity.

Ohmic loss and surface resistivity, especially at millimeter and submillimeter-wave frequencies, are important parameters for the development of resonators, high power sources, and transmission lines. In many cases surface resistivity is the limiting factor in power capability and efficiency of these devices.

Presently, measurement of surface resistivity at RF and microwave frequencies is typically made by constructing a closed resonator of the material to be analyzed, introducing radiation and measuring the Q or ohmic loss in the fundamental resonant mode of the resonator which is defined by resonator dimensions. This measurement may then be related to the surface conductivity.

Unfortunately, however, these presently practiced techniques for measurement become increasingly difficult to use at higher frequencies because of the shrinking apparatus dimensions required. Pill box resonators, for example, are known to be useful at frequencies typically only up to 10 GHz.

At much higher frequencies, over 70 GHz, optical resonators of the Fabry-Perot type have been used. The Fabry-Perot resonator includes two mirrors facing each other in open space. However, this design requires very high Q operation and critical alignment, thereby reducing the sensitivity and convenience of the method. Furthermore, high frequency operation is known to give rise to input/output coupling uncertainties.

Thus, the resistivity dependence on frequency of many materials, for example, even copper, is not adequately characterized at frequencies over 10 GHz. Moreover, high temperature superconductors have the potential of low resistivity at millimeter submillimeter wavelengths, out of the optimum range of current measurement methods, but potentially important for improving understanding and material development of these compounds. Measurements of low temperature superconductors at high frequency would also be of interest.

It is therefore the object of the present invention to provide a resonator measurement technique that can be readily extended into the higher frequency ranges without the disadvantages of the prior art methods. In particular, the invention minimizes the Q factor to enhance sensitivity, makes possible measurement at very high frequency, including into the Terahertz range, and does not have input/output coupling uncertainties built into the measurement, nor does the Q factor depend on a critical alignment.

SUMMARY OF THE INVENTION

In the present invention, a method and an apparatus for measurement of ohmic Q and surface resistivity of a material by exposing the material to resonant radiation is provided. Included is a source of selected radiation for producing a selected mode of resonant radiation. A cell for exposing a sample of the material to resonant radiation is provided which includes a substantially linear lumen having an open end forming an on axis aperture wherein the radiation from the source at a wavelength about the transmissive cutoff of the lumen is introduced and the resonant radiation is generated by diffraction about the aperture, and propagated within the lumen and at least a portion of the resonant radiation exits the cell. A detector is provided for detecting the radiation exiting the cell.

Preferably, the radiation is selected to provide a mode of resonant radiation that provides maximum coupling to the sample.

In preferred embodiments the cell comprises a lumen of substantially uniform cross-sectional area with a first and second open ends, forming first and second on axis apertures and the radiation is introduced through the first aperture and exits through the second aperture. Preferably, the interior walls of the lumen support the sample and the mode of the resonant radiation is selected for maximum coupling of the radiation to the walls, thereby maximizing the effect of surface resistance.

In many embodiments, the lumen is a round tubular lumen and the ohmic Q is given by:

$$Q_\Omega = \frac{r}{\delta}\left[1 - \left(\frac{m}{\upsilon_{mp}}\right)^2\right]$$

where r is the radius of said aperture, $\upsilon$ mp is the pth zero of the derivative of the $J_m$ Bessel function, $\delta=(\rho/f\mu)^{\frac{1}{2}}$ is the skin depth, $\rho$ is the surface resistivity f is the frequency, $\mu$ is the permeability and the resonant mode is selected where m is substantially greater than 1 and p is equal to or greater than 1.

In preferred embodiments, the resonant radiation exiting the lumen is spatially distributed outside the lumen, the distribution being a function of the resonant mode of the radiation, and the position of the detector is variable for optimum detection of a desired mode.

Preferably in various embodiments, the source is a laser source and the apparatus further includes coupling optics, the optics including a Vlasov coupler formed to transform the source radiation to produce a desired resonant mode in the cell. In particularly preferred embodiments, the source is a solid state millimeter wave source. A volume mode filter is preferably provided for filtering unwanted modes from the cell and a conical taper at the aperture of the cell through which the radiation enters the cell is provided for efficiently guiding the radiation into the cell.

A conical taper at the aperture of the lumen where the radiation exits may be further included and a Vlasov coupler may also be positioned at the aperture at the exit taper.

In yet other preferred embodiments, the lumen is of variable cross-sectional area for accommodating various frequencies of radiation. In such embodiment the cell is preferably comprised of a first and second cross-section, noncontinuous wall members forming the lumen therebetween wherein the wall members are separable to vary the cross-sectional area.

In other embodiments the wall members are separable and the sample is positioned about the perimeter of the lumen in the space formed by the separation for exposure to the radiation.

In many preferred embodiments a beam interference resonator is provided for providing reference signals for the detected resonant radiation.

In many preferred embodiments, a plurality of longitudinal modes are detected for each input transverse mode and the ohmic Q and diffractive Q are determined from the plurality of modes.

In particular embodiments the selected mode is the $TE_{61}$ mode. The material to be analyzed may be a conductor, a superconductor or a high temperature superconductor where the superconductivity occurs at temperatures greater than 35K.

In preferred embodiments the superconductor is cooled by flowing a radiation non absorbant supercooled gas, for example, $N_2$ or Ne through the lumen of the apparatus.

BRIEF DESCRIPTION OF THE DRAWINGS

We first briefly describe the drawings.

DETAILED DESCRIPTION

Figure 1:
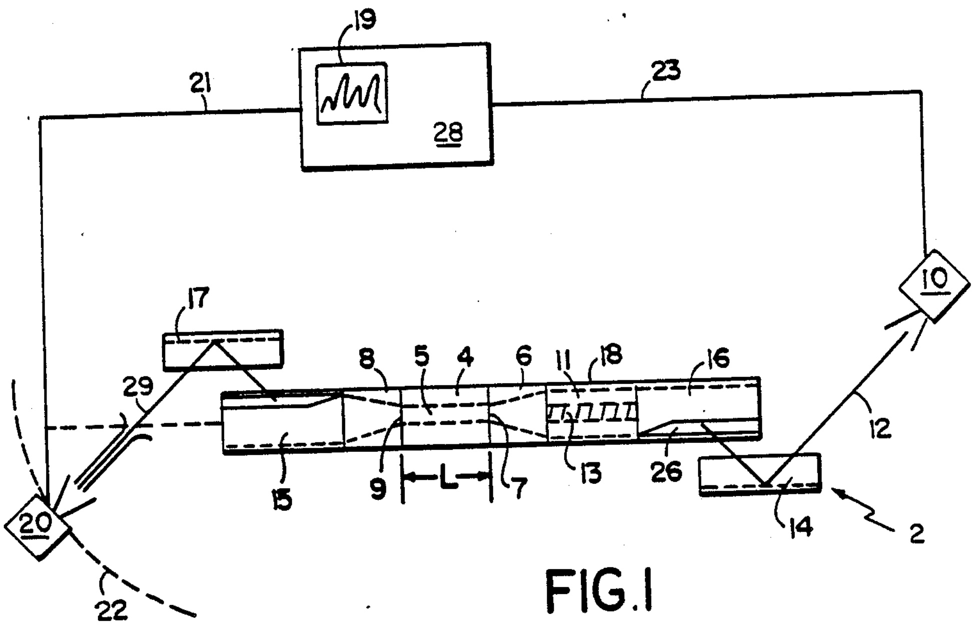
FIG. 1 is a cross sectional side view of an open tube resonator measurement apparatus according to the invention.

Referring to FIG. 1, in the preferred embodiment the measurement apparatus 2 includes an open tube resonator 4, comprised of a straight section circular aperture lumen tube including the material to be analyzed for exposure to radiation in the interior of the lumen and open at both ends. The apertures 7, 9 formed by the open ends of the tube are of substantially the same cross-sectional area as the lumen itself. Diffraction occurs for radiation introduced to the tube which is of a wavelength near the transmission cutoff of the dimensions of the aperture opening of the tube. This diffraction provides feedback for interference to establish resonances within the tube which may then be detected and related to ohmic loss and surface resistivity.

In the preferred embodiment, the open tube 4 is formed of the material to be analyzed, includes a lumen 5, with open apertures 7, 9 at both ends and is positioned between an input taper 6 and output taper 8 for most effectively guiding radiation 12 originating at a source 10 into and out of the tube 4, respectively. The radiation 12, from a frequency swept source 10, (which could be, for example, one of a variety of sources including solid state millimeter wave sources or laser sources) is directed to a reflective optic 14 which focuses the radiation onto a tubular transforming member 16 including a slit. The reflective optic 14 and transforming member 16 together form a Vlasov coupler and the coherent radiation from the source may thereby be mode transformed according to the coupler design, as is known in the art and described, for example by Vlasov et al. in *Radio Eng.*, 1978, Vol. 20, p. 14.

The transformed radiation is then introduced to a mode filter 18 which is preferably comprised of a tubular lumen, 11 with a radiative absorbing member 13 positioned about its axis for filtering any undesired on axis mode which might be passed from the coupler 16 to the resonator 4. It should be evident that the filter may be of a different design or omitted should on axis modes be desired.

The tube 4 thus acts as a waveguide. Near the cutoff frequency of a given tube, diffraction at the open end apertures provides feedback to establish resonances. The formation of such resonances by diffraction is discussed by, for example, Vainshtein in *Soviet Physics JETP*, 1963, Vol. 17, page 709. A full discussion of waveguides, electromagnetic resonators and the like is given by R. E. Collin in *Foundations for Microwave Engineering*, McGraw-Hill, 1966, N.Y.

The resonant radiation within the tube lumen 5 propagates down the tube and exits the lumen 5 through aperture 9 and then to the taper 8 and a second transforming Vlasov coupler 15 and 17. Finally the resonant radiation may be detected by detector 20.

The second taper 8 effectively guides the radiation to the second coupler 15, and the use of which is found to reduce the angular dispersion of radiation exiting the lumen and to enhance the observed signal at detector 20. It would be evident, however, that the couplers 15, 16 and tapers 6, 8 may be used, redesigned or omitted to produce a desired effect.

The angle at which the resonant radiation exits the lumen 5 is dependent upon the frequency, the resonant mode of the radiation and the design of the output aperture, and accordingly the detector may be angularly translated a full 180° along the line 22 for proper positioning to detect the desired mode at maximum sensitivity. Instead of or in combination with positioning the detector, the output taper 9 and Vlasvov 15 and 17 may be designed to effect the angle at which a given mode at a given input frequency exits the lumen 5. For example, as shown in FIG. 1, the signal for a mode 29, has intensity which is schematically shown to maximize at angle $\phi$ with respect to the resonator axis.

Figure 1A:
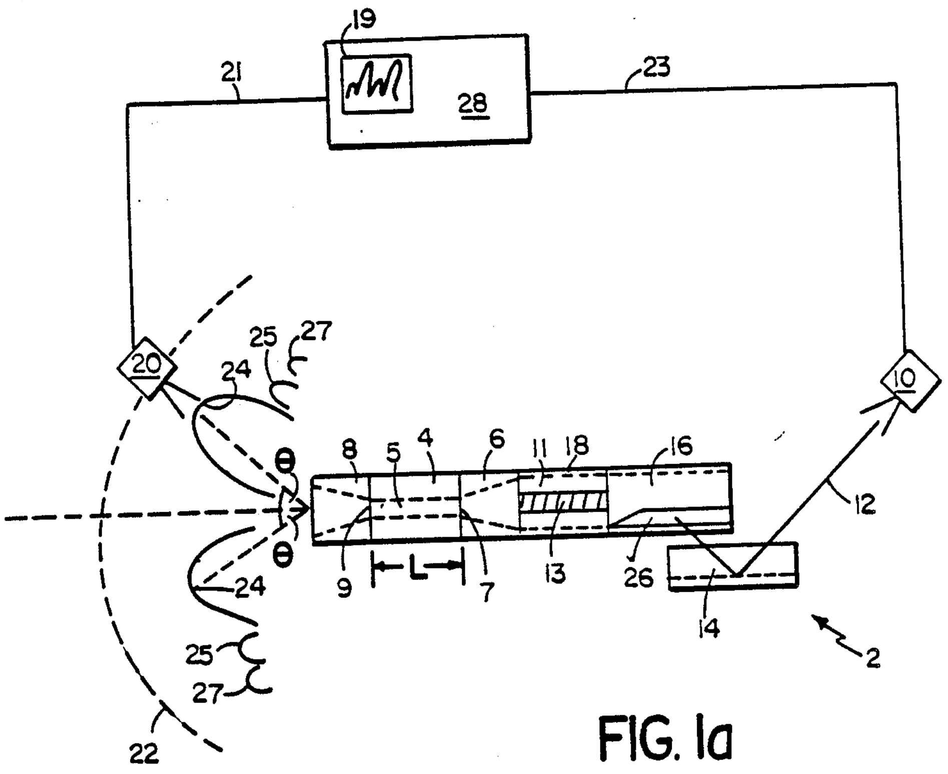
FIG. 1*a* is an alternate configuration of the apparatus in FIG. 1.
Figure 2:
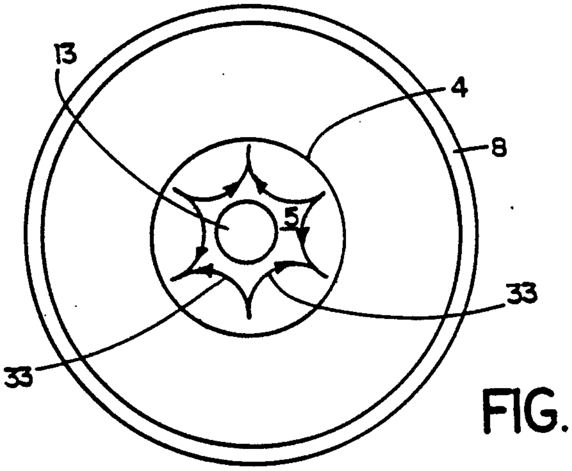
FIG. 2 is an end on view of the apparatus of FIG. 1.

Referring to FIGS. 1*a* and 2, an embodiment similar to FIG. 1 is shown where the exit Vlasov coupler 15 and 17 of FIG. 1 is removed and then the main peak of the mode 24 is symmetrically spread out about the resonator axis at angle $\theta$. In this embodiment the spatial discrimination between modes would be greater than in the embodiment of FIG. 1. In FIG. 2, an axis end on view from the detector side of the embodiment of FIG. 1*a* is shown. The figure shows the exit taper 8, the resonator tube 4 with lumen 5 and the absorbing member 13 of the filter 18. Also shown schematically are the electric vectors 33 of preferred resonant mode of radiation coupled to the walls of the lumen 5 as will be discussed further.

Alternatively, the exit conical tapes 8 and Vlasov 15, 17 are not used. In this configuration, the main lobe or peak of exit mode would be symmetrically spread out about the resonator area at an angle $\theta=90$.

Figure 3:
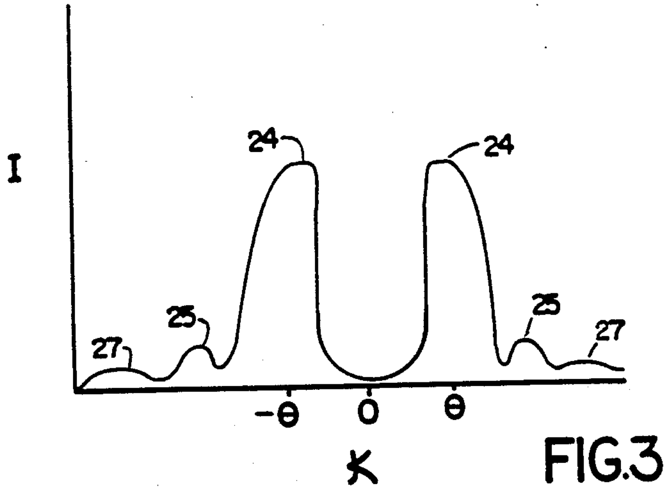
FIG. 3 is a schematic plot of intensity versus exit angle from an apparatus according to the invention.

Referring now to FIG. 3, the detector output intensity for the configuration shown in FIG. 1*a* is shown as a function of angle as the detector is translated along line 22. The energy of mode 24 is detected at highest intensity at angle plus or minus $\theta$. The other peaks 25 and 27 correspond to secondary peaks of the mode. It will be evident to those skilled in the art that detection of the selected mode at its optimal spatial distribution both enhances sensitivity of the measurement and descriminates against other modes which might also exit the tube 4.

The ohmic Q may be defined as the ratio of the time averaged energy stored in the cell times the frequency, divided by energy loss per unit time to the cell walls. For measurement of the ohmic Q and surface resistivity, the frequency of radiation from the source 10 is swept over a range and the intensity spectrum of a selected resonant mode is detected by detector 20. The ratio of the resonant frequency to the bandwidth of the mode may be related to the ohmic Q as is known.

Referring back to FIGS. 1 and 1*a*, the source 10 and detector 20 may be connected to via lines 21, 23, and controlled from a console 28 which further may include means for display 19 and recording of the observed signal.

The resonant modes to be established for ohmic measurements can be selected for maximum coupling to the sample in the cell. In a tubular cell, as shown in FIGS. 1–2, the sample is supported and exposed at the interior walls of the tube and therefore resonant modes which couple to the interior sides of the lumen are preferable. Preferably these are higher order modes than the fundamentals and provide a further benefit of allowing larger cell dimensions compared to the wavelength than if the fundamentals are used. Referring back now to FIG. 2 the use of a resonant mode 33 with maximized coupling to the inner surface of the lumen is shown. Modes coupled to the walls of a circular lumen as shown are often referred to as "whispering gallery modes" as will be described further herein below.

We have discovered that such an open end lumen measurement apparatus may be operated to minimize the Q factor for enhancing sensitivity to surface resistance, and for making measurements at very high frequency, into the Terahertz range, without requiring special design for input/output coupling, nor does the Q factor depend on a critical alignment.

We have further discovered that the present invention allows detection of more than a single longitudinal mode for a simple input transverse mode. This property is particularly advantageous since the ohmic Q is approximately the same for adjacent modes but diffractive Q varies in a known predictable way. Thus both $Q_\Omega$ and $Q_D$ can be determined from the signal of multiple modes exactly. It is known that $Q_D$ in particular can vary due to alignment errors. The present method allows calculations of the $Q_D$ from multiple modes and thus eliminates any error.

A cell with at least one open end reduces the mode density or preponderance of modes other than that desired for a measurement which would otherwise occur due to reflective effects from closed ends. Detection of the desired mode as a function of angle further discriminates against detection of undesired modes. Finally, selection of modes with maximum coupling to the sample surfaces maximizes the sensitivity of the measurement and detection of multiple longitudinal output modes for a single input transverse mode allows unambiguous calculation of both $Q_\Omega$ and $Q_D$.

The open tube resonator is a straight section of waveguide open preferably at both ends. In a cylindrical guide as shown in FIGS. 1 and 2, when the guide length, L, is much greater than the wavelength $\lambda$ of the radiation, the resonant modes established by the diffraction feedback, using the known transverse electric notation, $TE_{mp}$, are given by $$f_{mp} \simeq \frac{\upsilon_{mp}\, C}{2\pi r} \quad (1)$$

where $f_{mp}$ are the resonances of the radiation at frequency f, $\upsilon_{mp}$ is the pth zero of the $J'_m$ Bessel function, c is the speed of light, and r is the guide radius.

Assuming the space within the lumen to be a lossless dielectric, the total loss, $Q_T$, defined here as the time averaged energy stored in the cell times the frequency, divided by the energy loss per second depends only on the diffraction losses at the open ends and on the wall losses due to the surface resistivity or $$Q_T = (Q_D^{-1} + Q_\Omega^{-1})^{-1} \quad (2)$$

where $Q_D$ is the diffractive loss and $Q_\Omega$ is the ohmic loss. In the present invention, the input and output coupling is achieved through $Q_D$. The diffractive $Q_D$ is given by $$Q_D = \frac{4\pi}{(1 - R_1 R_2)} \left( \frac{L_1}{\lambda} \right)^2 \quad (3)$$

where $R_1$ and $R_2$ are the reflectivities at the resonator ends, $L_1$ is the length of the stored field, and $\lambda$ is the wavelength field. The value of $Q_D$ may be evaluated by known methods, using, for example, a computer program. The ohmic Q is given by:

$$Q_\Omega = \frac{r}{\delta} \left[ 1 - \left( \frac{m}{\upsilon_{mp}} \right)^2 \right]$$

where $\delta = (\rho/f\mu)^{\frac{1}{2}}$ is the skin depth, $\rho$ is the surface resistivity, f is the frequency, and $\mu$ is the permeability.

We further understand that, for a given surface resistivity, $Q_\Omega$ can be made much lower by using a surface mode which maximizes the coupling to the sample. In the preferred embodiments with a cylindrical cell as described above, the modes are selected where $m >> 1$ and p is equal to or greater than 1, typically equal to 1 or 2. These modes are also referred to as "whispering gallery" modes because they propagate along the surface similar to a well known acoustic effect in domed galleries and as illustrated by vectors 33 in FIG. 2. Minimizing $Q_T$ by employing the whispering gallery modes allows a lower $Q_D$ to be used which reduces the requirement on diagnostic source linewidth and frequency stability and increases the signal levels for measurement. This is an important consideration, especially in the higher wavelength ranges, near and above 70 GHz, for example, where the performance and availability of both presently known radiation sources and detectors decrease with increasing frequency. Thus the invention makes possible both the measurement of much lower resistivities at all frequencies and the accurate measurement of resistivity at higher frequencies heretofore unattainable with other types of resonators.

At the same time using a higher order mode, for example, the "whispering gallery" modes, allow use of resonator dimension which ar large relative to the wavelength, making practical measurements well into the Terahertz range. In fact one sample cavity could be used to make measurements at many frequencies by tuning to different modes as will be discussed herein below. Furthermore, an open resonator has an advantage over a closed resonator in going to higher order modes because the mode density is less, and the complication of input/output coupling holes is not necessary. Finally, the open tube can make use of diffractive coupling without ambiguity to the transverse mode excited, does not need alignment, and can work with a much lower Q.

Figure 4:
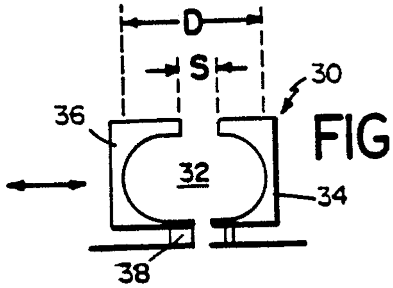
FIG. 4 is an end-on view of another embodiment of the invention for operation over a tunable range of frequencies.
Figure 4A:
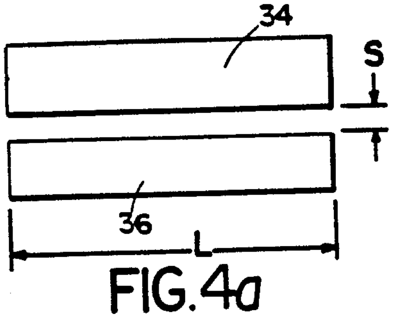
FIG. 4*a* is a top view of the embodiment of FIG. 4.

Referring now to FIGS. 4 and 4*a* another embodiment of the invention is described for providing a variable lumen aperture diameter for tuning the resonator for operation at a range of frequencies. The variable diameter resonator 30 in the preferred embodiment comprises a straight section circular aperature lumen 32 formed of half tube pieces 34 and 36. The resonator may be of a length, L. The diameter D of lumen 32 and thus its cross-sectional area, may be varied by varying the relative separation S of the pieces 34 and 36 by way of, for example, a translator 38 for tranlating piece 36. The piece 36 may then be translated to a position relative to the piece 34 corresponding to the desired diameter D may be continuously varied in coordination with a tuneable radiation source and the sample material analyzed for ohmic loss and surface resistivity as a function of frequency. Also the resonator could be tuned for use with a fixed frequency source.

Figure 5:
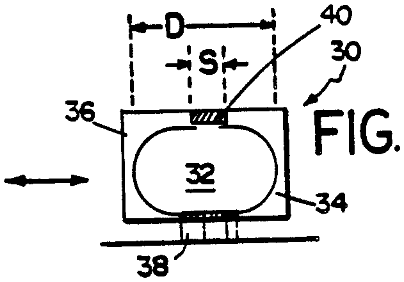
FIG. 5 is another embodiment of the invention.
Figure 5A:
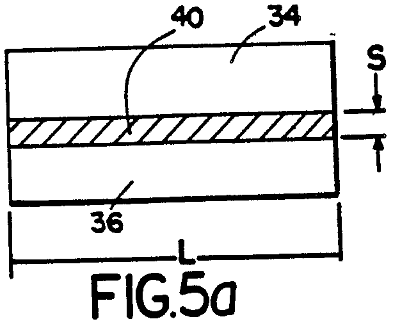
FIG. 5*a* is a top view of the embodiment of FIG. 5.

Referring now to FIGS. 5 and 5*a* and the embodiment similar to that of FIG. 4 is shown in which allows for measurements of various flat samples, at selected frequencies using the same resonator. The resonator lumen 32 is comprised of two lumen pieces 34 and 36 which may be operated to vary the relative separation S and the lumen diameter D by relative motion of the pieces 36 and 34 as described herein above. The pieces 34 and 36 are constructed of a reflective material, other than the material to be measured. Sample rests 42 and 44 are provided for supporting samples 40 of the material to be measured such that a face of the material 46 is exposed to the interior of the lumen and thereby the radiation introduced to the lumen.

The present embodiment provides for easy analysis particularly of various flat samples of materials which could not be formed into or exposed within a cell. Further, such samples may be analyzed at various frequencies by varying the diameter D of the lumen or various samples of a single size may be successively and easily exposed and measured.

Figure 6:
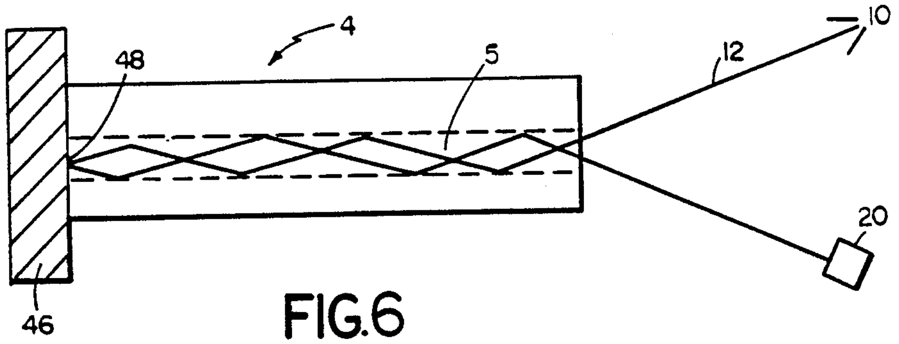
FIG. 6 is yet another embodiment of the invention.

Referring now to FIG. 6 another embodiment of the invention is shown for measurements of ohmic loss and resistivity from a reflective exposure of a bulk sample of a material. The resonator 4, preferably comprises an open ended lumen tube constructed of a reflective material other than that of the material to be analyzed. At a first end of the lumen a bulk sample 46 of the material to be analyzed is positioned about a first aperture of the lumen. Radiation from a source 10, is directed into the resonator 4, and is guided by the resonator to sample the where it reflects of the sample face 48 and is guided in return through the lumen 5 and exits the lumen with a preferential angle orientation dependent on the selected mode. The selected mode is then detected at a detector 20. Similar to the previously discussed embodiment, the method of FIG. 6 also allows analysis of samples which cannot be formed into a cell.

Figure 7:
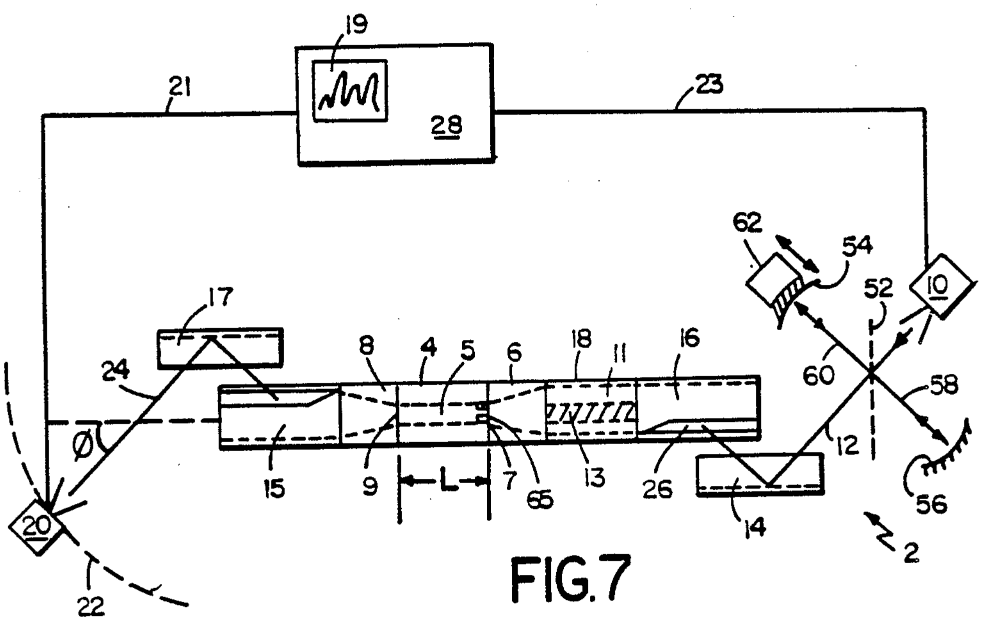
FIG. 7 is another embodiment of the invention.

Referring now to FIG. 7 another embodiment similar to that of FIGS. 1 and 2 is shown, further including a beam interference resonator consisting of elements 52 through 62 positioned between the source 10 and coupler mirror 14 for providing frequency reference signals and an aperture step at the entrance aperture for enhancing the diffractive Q. The interference resonator includes a beam splitter 52 and two focusing mirrors 54 and 56. The beam 12 from the source 10 impinges upon the beam splitter 52 producing component beams 58 and 60 which are directed to mirrors 54 and 56 and return to the beam splitter and interfere. For destructive interference, the relationship of the distance K, between the mirrors and the frequency f of the radiation must follow the known relationship where:

$$f = \frac{c}{2K}$$

As the frequency of the beam is swept at the source or the distance K is varied by, for example, translating mirror 54 as shown by arrow 62, an interference pattern in the signal detected at detector 20 will be superimposed on the resonant signal where the frequency position of the nodes of the interference pattern may be determined to provide a reference for measurement of the resonant mode frequency free of detector, or source error, or the like.

Figure 7A:
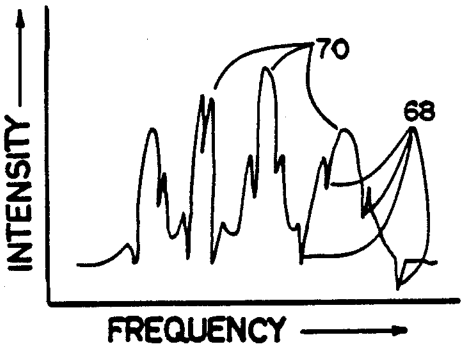
FIG. 7*a* is a schematic detector output from the embodiment of FIG. 7.

In FIG. 7*a*, the detected signal for a series of modes is shown illustrating the reference nodes, 68 on signals 70.

The embodiment of FIG. 7 may further include an entrance aperture step 65 for enhancing diffractive Q within the tube 4 in applications where this might be desirable. The step 65 acts to reduce the aperture diameter at the entrance aperture of the tube and may be formed integrally with the tube itself or as a separate component. In a particular embodiment, the step may be an adjustable step with a variable aperture opened and closed as an iris.

EXAMPLE

Referring back now to the FIG. 1, and the end on view at FIG. 2 measurements using a cylindrical resonator 4 made of copper will now be described. The resonator 4, is placed between two conical tapers 6, 8 and a Vlasov coupler 14 and 16 at one end to facilitate input/output coupling. A resonant mode, for example the $TE_{61}$ whispering gallery mode at a frequency 140 GHz, may be selected for analysis.

The Vlasov coupler including the transforming tube 16 and optic 14 is made of copper according to the selection criteria of the desired mode as is known, the dimensions and geometry of the coupler and design of the slit thus being selectable. In the present example, transforming tube 16 is of internal diameter 0.500 inches and length 4.25 inches. The slit 26 runs substantially the length of the transforming member 16 of about 3.54 inches and terminates at the end adjacent to the taper in a narrowed tip with angle 23.9° as is known in the art. The Vlasov coupler, 15, 17 at the exit end is similarly constructed.

The conical tapers, are e.g., again turned of copper at length 1.209 inches and taper angle 7°. The diameter of the tapers adjacent to the resonator is 0.203 and 0.500 inches at the ends away from the resonator. Mode filter 18 comprises a tube which has a central and absorbant material. Radiation of resonant modes not coupled to the surface as shown in FIG. 2 will be thus absorbed and not enter the resonator 4. Preferably, the absorbant material is carbon impregnated plastic, supported by teflon or polyethylene.

The electric field vectors 33 of the $TE_{61}$ resonant mode as shown schematically in FIG. 2 are closely coupled with the walls of the lumen rather than concentrated along the axis of the lumen as with fundamental modes. Selection of these modes thus maximizes the coupling about the walls where the sample is supported.

The source 10 may comprise an unleveled, tunable impatt diode with 3–4 MHz linewidth and up to 10 mW power swept across a frequency range from 135 to 145 GHz. The detector is preferably a heterodyne receiver with a Schottky diode mixer and a tripled Gunn oscillator as the local oscillator.

The resonator 4 comprises a tube of 0.203 inches internal diameter and 1.5 inches length bored through, a copper sample.

Figure 8:
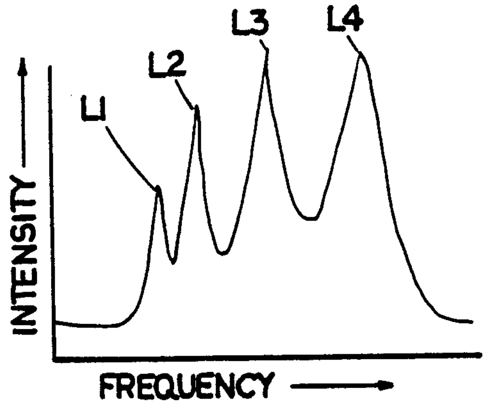
FIG. 8 is a schematic detector output simulating resonant modes using an apparatus according to the invention.

Referring now to FIG. 8, the detected signal for a copper resonator at room temperature is shown with the receiver viewing a $TE_{61}$ peak of the far field pattern where angle 0 =26° in FIG. 1 and the impatt diode beam source 10 is coupled through the Vlasov coupler 14 and 16. The four peaks L1, L2, L3 and L4 simulate four longitudinal modes with mode numbers 1 =2, 3, 4 and 5.

In the present simulation, the ability of the present invention to detect more than one longitudinal mode is demonstrated. Ohmic Q is approximately the same for adjacent modes, and diffractive Q varies in a predictable way as the inverse square of the mode number, $1^{-2}$. Therefore both $Q_{\Omega}$and $Q_D$ can be determined from the signal for 2 or more modes exactly; there being no independent parameters. This capability makes the present measurement apparatus insensitive to critical alignment, for example, such as a misalignment between the conical tapers and the resonator 4 which could significantly increase $Q_D$.

The $Q_T$determined from due to the width of the first peak in FIG. 8 (1 =2) is approximately 2000, an order of magnitude less than the limit due to the impatt diode linewidth and more than two orders of magnitude less than typically required with prior methods, for example, Fabry-Perot resonators. This low a $Q_T$is limited by the ohmic losses, $Q_D$ being approximately 5000 in this example. This simulation is consistent with the known copper resistivity at lower frequencies if extrapolated to 140 GHz (see, for example, L. W. Hinderks and A. Maione, *The Bell System Technical Journal*, Vol. 59, No. 1, 1980, page 43).

Other variations of the basic measurement apparatus shown in FIG. 1 are also possible. The Vlasov coupler 15 and 17 could be removed as shown in FIG. 1*a*. Also the conical taper 8 could be removed and the detector 20 placed at $\phi=90°$. For high Q operation a step may be formed at the input aperture.

It will further be evident to those skilled in the art that a lumen of desired dimensions may be formed of a material other than the material to be analyzed and the interior of the lumen at least partially coated with the material to be analyzed for exposing the material to radiation in the resonator. The lumen may then be cleared of the material and recoated with a second material and that second material analyzed thus obviating the requirment of manufacturing separate lumens of various best materials.

Ohmic loss and surface resistivity measurements could be equally as well made on high $T_c$ superconductor samples by employing the invention. Such measurements ar of particular interest for improving understanding and material development and because these materials, unlike low temperature superconductors or normal conductors, have the potential for low resistivity at millimeter and submillimeter wavelengths. For measurement of this material, samples formed as an open tube resonator must be cooled below their critical temperature, for example, by immersing the outside of the resonator in a cryogenic such as liquid $N_2$ while flowing a dry gas through the resonator tube, for example, to avoid condensation. For use with high temperature superconductors, liquid nitrogen ma be employed for steady state cooling of the cavity using cooling jackets if the superconducting material selected has a transition temperature above 77K, the temperature at which liquid nitrogen boils. It is known that Y—Ba—Cu—O materials have transition temperatures above 77K. The advantage of cooling at this temperature is that large amounts of heat can be removed by the liquid nitrogen a relatively high efficiencies. Other cooling fluids such as Ne, H, and He may be used if better superconducting properties are required by means of lower temperature operation.

Another cooling method could be to flow a supercooled gas such as $N_2$ or He through the resonator to cool only the radiation exposed working surface. The cooling gas could then act simultaneously as the lossless dielectric and the coolant. Advantages of this include direct contact of the cooling fluid with the superconductor surface and displacement of the atmosphere which would eliminate electromagnetic radiation absorption losses.

The use of narrow linewidth sources in combination with low $Q_{\Omega}$open tube resonator modes could make possible measurements of high frequency resistivity which is many orders of magnitude lower than that of copper. These measurements would be useful in developing improved RF properties of high $T_c$ superconductors.

It will be understood by those skilled in the art that many variations of the embodiments described here may be made without departing from the scope of the invention. For example, other resonant modes besides the $TE_{61}$ mode may be used. For example, TE modes with other mode numbers or the transverse magnetic modes, known as TM modes. Configurations besides circular geometry of FIGS. 1-7 might be employed, for example, oval lumens or square lumens could be used. The invention therefore, is to be limited only by the following claims.

What is claimed is:

1. An apparatus for measurement of ohmic Q and surface resistivity of a material by exposing said material to resonant radiation comprising:

a source of selected radiation producing a selected mode of resonant radiation, a cell for exposing a sample of said material to resonant radiation including a substantially linear lumen having an open end which forms an on axis aperture wherein said radiation from said source at a wavelength about the transmissive cutoff of said lumen is introduced and said resonant radiation is generated by diffraction about said aperture, and propogated within said lumen and at least a portion of said resonant radiation exits said cell, a detector for detecting the radiation exiting said cell, and an analyzer for relating said detected radiation to ohmic Q and surface resistivity.

2. The apparatus of claim 1 wherein said radiation is selected to provide a mode of resonant radiation that provides maximum coupling of said radiation to said sample.

3. The apparatus of claim 1 wherein said cell comprises a lumen of substantially uniform cross-sectional area with a first and second open ends, forming first and second on axis apertures and said radiation is introduced through said first aperture and exits through said second aperture.

4. The apparatus of claim 3 wherein said interior walls of said lumen support said sample and the modes of said resonant radiation is selected for maximum coupling of said radiation to said walls, thereby maximizing the effect of surface resistance.

5. The apparatus of claims 1, 2, 3 or 4 wherein said lumen is a round tubular lumen and said ohmic Q is given by:

$$Q_\Omega = \frac{r}{\delta}\left[1 - \left(\frac{m}{v_{mp}}\right)^2\right]$$

where r is the radius of said aperture, $v$ mp is the pth zero of the derivative of the Jm Bessel function, $v=(\rho/f\mu)$ is the skin depth, $\rho$ is the surface resistivity and, $\mu$ is the permeability and said resonant mode is selected where m is substantially greater than 1 and p is equal to or greater than 1.

6. The apparatus of claims 1, 2, 3 or 4 wherein said resonant radiation exiting said lumen is spatially distributed outside said lumen, said distribution is a function of the resonant mode of said radiation, and the position of said detector is variable for optimum detection of a desired mode.

7. The apparatus of claims 1, 2, 3 or 4 wherein said source is a laser source and said apparatus further includes coupling optics, said optics including a Vlaslov coupler formed to transform said source radiation to produce a desired resonant mode in said cell.

8. The apparatus of claim 7 wherein said source is a solid state millimeter wave source.

9. The apparatus of claim 7 further comprising a volume mode filter for filtering unwanted modes from said cell and a conical taper at the aperture of said cell through which said radiation enters said cell for efficiently guiding said radiation into said cell.

10. The apparatus of claim 9 further comprising a conical taper at the aperture of said lumen where said radiation exits.

11. The apparatus of claim 10 further comprising a Vlasov coupler at the aperture at which said radiation exits.

12. The apparatus of claim 9 further comprising a Vlasov coupler at the aperture at which said radiation exits.

13. The apparatus of claims 1, 2, or 3 further comprising a conical taper at the aperture of said lumen where said radiation exits.

14. The apparatus of claim 10 further including a Vlasov coupler at the aperture at which said radiation exits.

15. The apparatus of claim 1, 2, or 3 further comprising a Vlasov coupler at the aperture at which said radiation exits.

16. The apparatus of claims 1, 2 or 3 wherein said lumen is of variable cross-sectional area for accommodating various frequencies of radiation.

17. The apparatus of claim 16 wherein said cell is comprised of a first and second cross-section, noncontinuous wall members forming said lumen therebetween wherein said wall members are separable to vary said cross-sectional area.

18. The apparatus of claim 17 wherein said wall members are separable and said sample is positioned about the perimeter of said lumen in the space formed by said separation for exposure to said radiation.

19. The apparatus of claims 1, 2 or 3 wherein the selected mode is the $TE_{61}$ mode.

20. A method for measurement of the ohmic Q and surface resistivity of a material comprising the steps of exposing a sample of said material to resonant radiation produced in a cell comprised of a substantially linear lumen having an open end forming an on axis aperture wherein radiation of a wavelength about the transmission cutoff of said lumen is introduced through said lumen, and at least a portion of said resonant radiation exits said lumen, selecting the resonant mode of said radiation for detecting said radiation exiting said cell, and analyzing said radiation to determine the ohmic Q and surface resistivity.

21. The method of claim 20 further comprising selecting said resonant mode of radiation for maximum coupling of said radiation to said material.

22. The method of claim 20 wherein said cell comprises a lumen of substantially uniform cross-sectional area with a first and second open ends, forming first and on axis second apertures and said radiation is introduced through said first aperture and exits through said second aperture.

23. The method of claim 20 wherein said lumen is a round tubular lumen and the ohmic Q is given by:

$$Q_\Omega = \frac{r}{\delta}\left[1 - \left(\frac{m}{v_{mp}}\right)^2\right]$$

where r is the radius of said aperture, $v_{mp}$ is the pth zero of the derivative of the Jm Bessel function, $\delta=(\rho/f\mu)$ is the skin depth, $\rho$ is the surface resistivity and, $\mu$ is the permeability and said resonant mode is selected where m is substantially greater than 1 and p is greater than or equal to 1.

24. The method of claims 20, 21, 22 or 23 wherein said resonant radiation exiting said lumen is spatially distributed outside said lumen, said distribution is a function of the resonant mode of said radiation, and said method comprises detecting said radiation exiting said lumen at the optimum angle for a desired mode.

25. The method of claims 20, 21, 22, or 23 wherein said radiation arises from a laser source and said apparatus further includes coupling optics, said optics including a Vlaslov coupler formed to transform said source radiation to produce a desired resonant mode in said cell, volume mode filter for filtering unwanted modes from said cell, a conical taper at the aperture of said cell through which said radiation enters said cell for efficiently guiding said radiation into said cell, and a conical taper at the aperture of said lumen where said radiation exits, and said method comprises forming said coupler said filter and said tapers to produce the desired mode in said resonator.

26. The method of claim 25 wherein said source is a solid state millimeter source.

27. The method of claims 20, 21, 22 or 23 wherein said lumen is of variable cross-sectional area and said method comprises selecting said area for accommodating various frequencies of radiation.

28. The method of claim 24 wherein said cell is comprised of a first and second cross-section, noncontinuous wall members forming said lumen therebetween wherein said wall members are separable to vary said cross-sectional area.

29. The method of claim 24 wherein said wall members are separable and said method includes positioning said sample about the perimeter of said lumen in the space formed by said separation for exposure to said radiation.

30. The method of claims 17, 18, 19 or 20 wherein the selected mode is the $TE_{61}$ mode.

31. The apparatus of claims 1, 2 or 3 or the method of any of claims 20, 21, 22 or 23 wherein said material is a conductor.

32. The apparatus of claims 1, 2 or 3, or method of claims 20, 21, 22 or 23 wherein said material is a superconductor.

33. The apparatus or method of claim 32 wherein said material is cooled below the critical temperature of said superconductor.

34. The apparatus or method of claim 33 wherein said cooling is provided by flowing a non-absorbing supercooled gas through said lumen.

35. The method or apparatus of claim 34 wherein said gas is $N_2$ or Ne.

36. The apparatus of claims 1, 2, or 3, or method of claims 20, 21, 22, or 23 wherein said superconductor superconducts at temperatures greater than 35K.

37. The apparatus of any of claims 1, 2 or 3 or the method of claims 20, 21, 22 or 23 wherein a plurality of longitudinal modes are detected for each input transverse mode and the ohmic Q and diffractive Q are determined from said plurality of modes.

38. The apparatus of claims 1, 2 or 3 or the method of claims 20, 21, 22 or 23 wherein a beam interference resonator is provided for providing reference signals for said detected resonant radiation.

* * * * *

UNITED STATES PATENT AND TRADEMARK OFFICE
CERTIFICATE OF CORRECTION

PATENT NO. : 4,968,945

DATED : November 6, 1990

INVENTOR(S) : Woskov, etal

It is certified that error appears in the above-identified patent and that said Letters Patent is hereby corrected as shown below:

Column 7, line 5: change "ar" to -- are --.

Column 10, line 9: change "ar" to -- are--.
line 20: change "ma" to -- may --.
line 28: change "a" to -- at --.

Column 13, line 20: change "claim 24" to -- claim 27 --.
line 25: change "claim 24" to -- claim 27 --.

Column 14, line 1 : change "claims 17,18,19 or 20" to -- claims 20,21,22,or 23 --.

Signed and Sealed this

Eighth Day of December, 1992

*Attest:*

DOUGLAS B. COMER

*Attesting Officer*

*Acting Commissioner of Patents and Trademarks*